United States Patent
Nitsche et al.

(10) Patent No.: US 10,048,487 B2
(45) Date of Patent: Aug. 14, 2018

(54) MICROMIRROR

(71) Applicant: Robert Bosch GmbH, Stuttgart (DE)

(72) Inventors: Heiko Nitsche, Reutlingen (DE); Frederic Njikam Njimonzie, Reutlingen (DE); Wolfram Schock, Ohmenhausen (DE); Joerg Muchow, Reutlingen (DE); Helmut Grutzeck, Kusterdingen (DE); Zoltan Lestyan, Martonvasar (HU)

(73) Assignee: ROBERT BOSCH GMBH, Stuttgart (DE)

( * ) Notice: Subject to any disclaimer, the term of this patent is extended or adjusted under 35 U.S.C. 154(b) by 47 days.

(21) Appl. No.: 14/364,991

(22) PCT Filed: Oct. 23, 2012

(86) PCT No.: PCT/EP2012/070925
§ 371 (c)(1),
(2) Date: Jun. 12, 2014

(87) PCT Pub. No.: WO2013/091939
PCT Pub. Date: Jun. 27, 2013

(65) Prior Publication Data
US 2015/0036203 A1 Feb. 5, 2015

(30) Foreign Application Priority Data
Dec. 22, 2011 (DE) .................. 10 2011 089 514

(51) Int. Cl.
*G02B 26/08* (2006.01)
*G02B 7/182* (2006.01)
(Continued)

(52) U.S. Cl.
CPC ........ *G02B 26/0833* (2013.01); *B81B 3/0043* (2013.01); *G02B 7/1821* (2013.01);
(Continued)

(58) Field of Classification Search
CPC .......................... G02B 26/101; G02B 26/105; G02B 26/0841; G02B 26/085; G02B 26/0833;
(Continued)

(56) References Cited

U.S. PATENT DOCUMENTS 6,198,180 B1 * 3/2001 Garcia .................. B81B 3/0062
310/36
7,616,372 B2 11/2009 Miller et al.
(Continued)

FOREIGN PATENT DOCUMENTS

| CN | 101393105 A | 3/2009 |
|---|---|---|
| CN | 101846867 A | 9/2010 |
| DE | 10 2010 062 591 | 6/2012 |

OTHER PUBLICATIONS

International Search Report, PCT International Application No. PCT/EP2012/070925, dated Feb. 4, 2013.
(Continued)

*Primary Examiner* — Stephone B Allen
*Assistant Examiner* — Rahman Abdur
(74) *Attorney, Agent, or Firm* — Norton Rose Fulbright US LLP; Gerard Messina

(57) ABSTRACT

A micromirror including a first layer having a first main extension plane, and a second layer having a second main extension plane, the first main extension plane and the second main extension plane being situated parallel to one another, the first layer and the second layer being sectionally connected to one another via at least one connection area, at least one spring element being implemented in the first layer, a movably suspended mirror plate being implemented in the second layer, the mirror plate having a mirror surface on a first side parallel to the main extension plane and being connected on an opposing second side via the connection area to an anchor of the spring element, a part of the spring element on the second side of the mirror plate being mov-
(Continued)

ably situated in relation to the mirror plate. A two-mirror system having such a micromirror is also provided.

35 Claims, 8 Drawing Sheets

(51) Int. Cl.
 *G02B 26/10* (2006.01)
 *B81B 3/00* (2006.01)
(52) U.S. Cl.
 CPC ......... *G02B 26/101* (2013.01); *G02B 26/105* (2013.01); *B81B 2201/042* (2013.01); *B81B 2203/0109* (2013.01); *B81B 2203/0163* (2013.01)
(58) Field of Classification Search
 CPC .... G02B 7/1821; G02B 7/182; G02B 5/0808; G02B 5/08; G02B 5/085; G02B 26/0816; G02B 26/08335; G02B 26/0858; G02B 26/0866; B81B 2203/0163; B81B 2203/0109
 USPC ............ 359/201.2, 202.1, 212.2–214.1, 359/223.1–224.1, 225.1–226.2, 871–875; 356/201.2, 202.1, 212.2–214.1, 356/223.1–224.1, 225.1–226.2, 872
 See application file for complete search history.

(56) References Cited

U.S. PATENT DOCUMENTS

| | | | |
|---|---|---|---|
| 2006/0268383 A1* | 11/2006 | Cho | H02N 1/008 359/225.1 |
| 2007/0159025 A1 | 7/2007 | Mushika | |
| 2007/0273946 A1* | 11/2007 | Kato | G02B 26/0833 359/224.1 |
| 2008/0130077 A1* | 6/2008 | Park | G02B 26/105 359/202.1 |
| 2010/0103494 A1* | 4/2010 | Moidu | G02B 26/0841 359/225.1 |
| 2011/0122101 A1 | 5/2011 | Kurokuza | |
| 2012/0147444 A1 | 6/2012 | Pinter et al. | |

OTHER PUBLICATIONS

Hsu, S., et al., "Fabrication and Characterization of a Dynamically Flat High Resolution Micro-Scanner," *J. Opt. A: Pure Appl. Opt.* vol. 10, Paper 044005 (2008).
Urey, H., "MEMs Scanners for Display and Imaging Applications," *Proceedings of the SPIE*, vol. 5604, pp. 218-229 (2004).

\* cited by examiner

MICROMIRROR

BACKGROUND INFORMATION

A movement at high frequency in at least one axis is necessary to build up an image with the aid of line-by-line writing of a projection area ("flying spot"). Exclusively resonant oscillating arrangements come into consideration to achieve the required frequencies greater than 10 kHz up to 50 kHz. A great variety of micromirrors have been provided in recent years. In part, mirrors have been implemented which oscillate only in one axis; in part, gimbal-mounted mirrors have been developed, which either perform resonant oscillations in both axial directions, or operate quasi-statically in one direction.

The significance of the product of mirror size and deflection, the so-called theta-D product, and the frequency for the image quality of a microscanner are described in MEMS Scanners for Display and Imaging Applications, Proc. of SPIE, volume 5604.

In addition to the three parameters mirror size, deflection, and frequency, the mirror deformation of a micrometer oscillating at high frequencies may amount only to approximately ¹/₁₀ of the wavelength of the laser light used. In the event of a greater deformation, the spot would be widened, which worsens the resolution of the image. Because of the inertia of the mirror itself and the counterforces acting on the mirror plate, as are exerted by the springs tensioned upon deflection of the mirror, this is a requirement which is very difficult to meet. By optimizing the suspension points, attempts have previously been made to optimize the deformation by intrinsic inertia of the plate and to optimize the deformation by the spring engagement with respect to a preferably small dynamic deformation of the mirror plate.

In general, a metallization preferably made of silver or aluminum is used for the reflective surface of micromirrors. The carrier of a micromirror is made of silicon, for example. The entire mirror plate therefore represents a bimetal. This results in temperature-dependent static deformation of the mirror.

SUMMARY

An object of the present invention is to provide an improved resonant micromirror having a rotational axis.

For a 2D scanner, which is constructed from two mirrors, each having one rotational axis, i.e., as a so-called 2×1D concept, a resonant mirror is necessary which is placed in the beam path as a second mirror after a first mirror. The laser beam is already deflected by the first mirror in a first y direction, before it is incident on the second mirror. A second mirror having an approximately rectangular cross section is necessary, the extension in the y direction (dimension in the rotational axis direction) being significantly greater than in the previously provided mirrors in the related art. Because the beam is first incident on a first quasi-static mirror, the beam must be incident so flatly that after the reflection on the resonant mirror, it passes by the outer edge of the quasi-static chip in spite of the widening taking place. This flat incidence results in an elliptical deformation of the laser spot on the resonant mirror, which is greater than the elliptical deformation which must be expected in the case of a gimbal-mounted 2D mirror. In the case of a gimbal-mounted mirror, the beam also may not be incident arbitrarily steeply. The exiting beam must be guided past the incident beam after reflection in consideration of all deflections. At a laser spot size of 1 mm, this would result in a mirror diameter of approximately 1.5 mm in the direction perpendicular to the axis. From geometric requirements of the optical arrangement of a 2×1D concept, at a spot diameter of 1 mm, the mirror must span a generally rectangular surface, which has an extension perpendicular to the rotational axis of 1.8 mm to 2.2 mm and parallel to the rotational axis of approximately 2.4 mm. These boundary conditions, and the requirement for a mirror to have a deformation of less than λ/10, may only be achieved with a very stiff, but simultaneously very long spring, as shown hereafter:

The resonance of a mechanical oscillator is given by $$f = 2\pi\sqrt{\frac{k}{I}} \qquad (1)$$

where k denotes the spring stiffness and I denotes the inertia of the oscillator. The inertia of a rectangular plate is $$I = \frac{1}{12}m(x^2 + y^2) \qquad (2)$$

i.e., it increases with the third power of the dimension in the direction perpendicular to the rotational axis.

The deformation of a round mirror is described in Fabrication and characterization of a dynamically flat high resolution micro-scanner, Journal of Optics. A (2008), number 10, Paper 044005, 8 p., by $$\delta \cong \frac{D^5 f^2 \Theta}{t^2} \qquad (3)$$

where D denotes the mirror diameter, f denotes the mirror frequency, Θ denotes the deflection angle, and t denotes the mirror thickness. A similar high dependence of the dynamic mirror deformation on the mirror size has already been shown for a square mirror.

In order that a large mirror, which is operated at high resonant frequency, does not have an excessively large dynamic deformation, the mirror plate should have a great thickness, in the case of the intended dimensions >100 μm, preferably 200 μm.

The inertia of the mirror plate increases with the first power with increasing thickness, as shown in equation (2). To achieve a resonant frequency>10 kHz, preferably a frequency of 20 kHz, a very stiff spring is needed.

The stiffness of a torsion spring having a rectangular cross section is given by:

$$K \cong \frac{Gbw^3}{l} \qquad (4)$$

where w denotes the smaller dimension, b denotes the larger dimension of the rectangular cross section, l denotes the length of the spring, and G denotes the shear modulus.

The stiffness of a flexible spring having a rectangular cross section is given by:

$$K \cong \frac{Ebw^3}{l} \quad (5)$$

where w denotes the dimension in which bending occurs, b denotes the dimension which is transverse to the bending, l denotes the length of the spring, and E denotes the modulus of elasticity. Whether a torsion spring or a flexible spring is used, the spring must have large dimensions in the dimensions of the cross section to have a high stiffness.

The tilt angle of the mirror plate should be as large as possible, but at least 10°. This requires a specific spring length, so that the stress in the spring does not become excessively large. It is known from the classical case of a flexible spring that with increasing curvature and increasing distance of the surface from the neutral fiber, the stress on the surface of the spring increases. If a large bending angle and a high stiffness are required, the stress in the spring may only be decreased by a greater spring length l. A long spring having a large cross section is thus necessary to implement a stiff spring, which does not break in the event of a large deflection. Simultaneously, the chip surface should be as small as possible, since the costs increase proportionally in this way.

The resonant arrangement should have a high level of robustness against undesired modes. The interfering modes should be above the useful mode as much as possible and should lie at the greatest possible distance therefrom, so that no shift of the modes toward one another occurs even in the event of manufacturing variations in the frequency band. In addition, it is desirable to have design freedom in the selection of the engagement point of the springs on the mirror plate, to be able to compensate dynamic deformations against each other.

The present invention relates to a micromirror including a first layer having a first main extension plane, and a second layer having a second main extension plane, the first main extension plane and the second main extension plane being situated parallel to one another, the first layer and the second layer being sectionally connected to one another via at least one connection area, at least one spring element being implemented in the first layer, a movably suspended mirror plate being implemented in the second layer, the mirror plate having a mirror surface on a first side parallel to the main extension plane and being connected on an opposing second side via the connection area to an anchor of the spring element, a part of the spring element being movably situated on the second side of the mirror plate in relation to the mirror plate. A compact construction may advantageously be achieved in the case of such a micromirror in spite of the spring length required for a movable suspension of the mirror plate.

One advantageous embodiment of the micromirror according to the present invention provides that the connection area is formed from an intermediate layer between the first layer and the second layer. Such a micromirror may advantageously be manufactured easily from a multilayer substrate, in particular from an SOI substrate.

Another advantageous embodiment of the micromirror according to the present invention provides that the connection area is formed from a structured partial area of the first layer or also the second layer. Such a micromirror may advantageously be constructed particularly simply, namely generally from only two layers. Such a connection area may advantageously be configured to be particularly thick. Large deflection angles of the movable mirror plate are particularly advantageously possible in this case. Very large mirror plates are also particularly advantageously possible in this case, under which a large part of the spring element may be situated in spite of the deflection.

One advantageous embodiment of the micromirror according to the present invention provides that the anchor is situated under the surface center of gravity of the mirror plate. The surface normal through the surface center of gravity also extends through the anchor. It is advantageous that the smallest torques are introduced into the mirror at this point; that is why a deformation of the mirror by deflection is avoided.

One advantageous embodiment of the micromirror according to the present invention provides that the spring element has a first extension perpendicular to the first main extension plane and a second extension parallel to the first main extension plane, the first extension being greater by the factor of 2, preferably by the factor of 10 than the second extension. Such a spring element may advantageously achieve a high stiffness in torsional strain, with a small surface occupied simultaneously in the main plane. Multiple spring elements or particularly long spring webs or also a large number of spring webs or folded spring elements may advantageously be provided in this case.

One advantageous embodiment of the micromirror according to the present invention provides that a predominant part of the spring element on the second side of the mirror plate is movably situated in relation to the mirror plate. A particularly compact construction of the micromirror is advantageously possible in this way.

One advantageous embodiment of the micromirror according to the present invention provides that the mirror plate is movable around a rotational axis and the spring element has at least one web, which is situated parallel to the rotational axis. A suspension of the mirror plate using a torsion spring is advantageously possible in this way. One particularly advantageous embodiment of the micromirror according to the present invention provides that the spring element has at least three webs, which are situated parallel to the rotational axis. A particularly long spring length may advantageously be achieved in this way, which mechanically loads the spring less strongly in the event of torsion.

One advantageous embodiment of the micromirror according to the present invention provides that the micromirror has at least two spring elements, which are connected to a shared anchor.

Another advantageous embodiment of the micromirror according to the present invention provides that the micromirror has at least two spring elements, which are each connected to a separate anchor.

One advantageous embodiment of the micromirror according to the present invention provides that the micromirror has at least two spring elements. In this way, the mirror may advantageously be suspended symmetrically and without bending the load of the spring perpendicular to the main plane.

One advantageous embodiment of the micromirror according to the present invention provides that a first frame is implemented in the first layer and the spring element is connected to the first frame. The spring element may advantageously be suspended in the first layer in this way, and the micromirror thus obtains a particularly flat structural shape. One particularly advantageous embodiment of the micromirror according to the present invention provides that a second frame is implemented in the second layer, which is connected to the first frame via the connection area. The frame may advantageously be reinforced in this way.

The present invention also relates to a two-mirror system having a first mirror and at least having one second micromirror according to one of the preceding claims, the arrangement representing a 2D scanner, the first mirror having a first rotational axis and the second mirror having a second rotational axis, which is perpendicular to the first rotational axis, the second micromirror being situated opposite the first mirror in such a way that a laser beam which irradiates both mirrors is deflectable in two directions.

DETAILED DESCRIPTION OF EXAMPLE EMBODIMENTS

Figure 1:
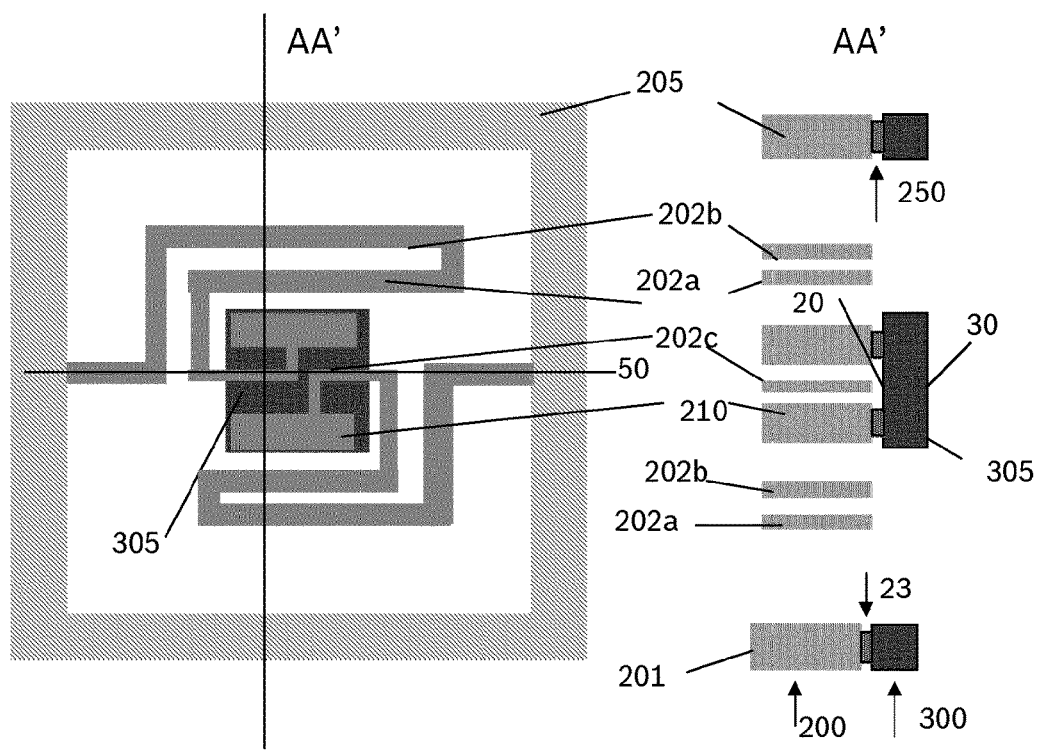
FIG. 1 shows a first exemplary embodiment of the micromirror according to the present invention.

FIG. 1 shows a first exemplary embodiment of the micromirror according to the present invention. A micromirror is shown including a first layer 200 having a first main extension plane, a second layer 300 having a second main extension plane, the first main extension plane and the second main extension plane being situated parallel to one another, and first layer 200 and second layer 300 being sectionally connected to one another via at least one connection area 23. At least one spring element, in this example two spring elements 202, are implemented in first layer 200. A movably suspended mirror plate 305 is implemented in second layer 300, mirror plate 305 having a mirror surface on a first side 30 parallel to the main extension plane and being connected on an opposing second side 20 via connection area 23 to an anchor 210 of spring element 202. A part of spring element 202 is, spaced apart by connection area 23, movably situated on second side 20 of mirror plate 305 in relation to mirror plate 305. The micromirror has a first frame 205, on which spring element 202 is also anchored in such a way that mirror plate 305 is fastened thereon with the aid of spring element 202 so it is movable in relation to first frame 205. In this exemplary embodiment, a second frame, which is connected to first frame 205 via connection area 23, is also implemented in second layer 300.

The provided micromirror includes two structured layers 200, 300, which are preferably formed in silicon, and an intermediate layer 250, which connects the elements, which are implemented in the two layers, at the desired points. In first layer 200, spring elements 202, which connect the mirror plate to frame 205, are implemented by a trenching process, for example. Surface 201 of this first layer 200, which faces away from second layer 300, is referred to as front side 201. In second layer 300, the mirror surface is implemented by a trenching process, for example. The mirror surface is located on the opposing side of the surface of first layer 200 and is referred to as first side 30 or also as a rear side. To produce "as much spring as possible" with the least possible chip surface simultaneously, first layer 200 is designed to be as thick as possible. The ratio of the thickness of this layer to the width of the widest spring element is at least a factor of 2, preferably a factor of 10. Spring element 202 thus has a first extension perpendicular to the first main extension plane and a second extension parallel to the first main extension plane, the first extension being greater by the factor of 2, preferably by the factor of 10, than the second extension.

Alternatively to intermediate layer 250, it is also possible that connection area 23 is formed from a structured partial area of first layer 200 or also second layer 300.

Spring elements 202 are placed sectionally at the points under mirror 305 at which the tilting of the mirror permits this. This is the case in the area of rotational axis 50. Further spring element areas may be placed between the mirror and the frame.

In this exemplary embodiment, mirror 305 is connected via a wide attachment part 210 to first layer 200, in which the spring elements are implemented. First areas of the spring elements, which simultaneously represent the connection to remaining spring system 202, engage on this attachment part 210. By tilting the mirror, the first area and all further areas of the spring elements, whose axis lies parallel to rotational axis 50 of the mirror, are twisted. Therefore, the torsion is distributed on the entire length of all areas of spring elements 202 which lie parallel to rotational axis 50 of mirror plate 305. These areas are referred to as webs.

In this exemplary embodiment, a first variant of the micromirror according to the present invention is shown, in which the areas of the spring elements, which are required for the overall torsion, and which lie parallel to rotational axis 50, are implemented by two meanders lying parallel to the rotational axis. According to FIG. 1, the particular meanders include only one loop having two webs, which lie parallel to rotational axis 50. However, an arbitrary number of loops is also possible. To avoid an imbalance, the arrangement of the spring system should be aligned parallel to rotational axis 50. This also applies for all further provided arrangements. Both exposed spring elements 202, which are used for the overall torsion of the arrangement, and attachment elements in the form of anchors 210, in which the intermediate layer remains as a connection area, are located under the mirror. Viewed from front side 201, anchors 210 have wider dimensions than the spring elements, but at least than the areas of the spring elements which are located under the mirror. It is thus possible to implement both areas of the spring elements simultaneously during a sacrificial etching process. Because the attachments engage on the outer edges of the mirror plate, the arrangement may be optimized with respect to the dynamic deformation of the mirror plate.

FIG. 2 shows a second exemplary embodiment of the micromirror according to the present invention, in which the attachment of the spring elements on the mirror plate is implemented centrically.

Figure 2A:
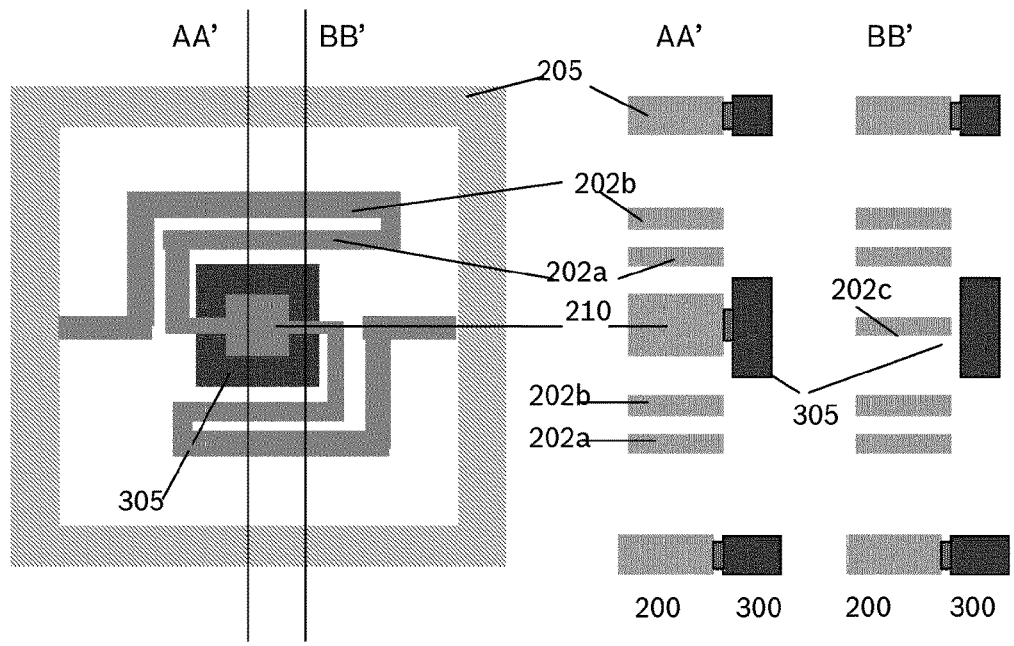
FIG. 2 shows a second exemplary embodiment of the micromirror according to the present invention, in which the attachment of the first springs to the mirror plate is implemented centrically.
Figure 2B:
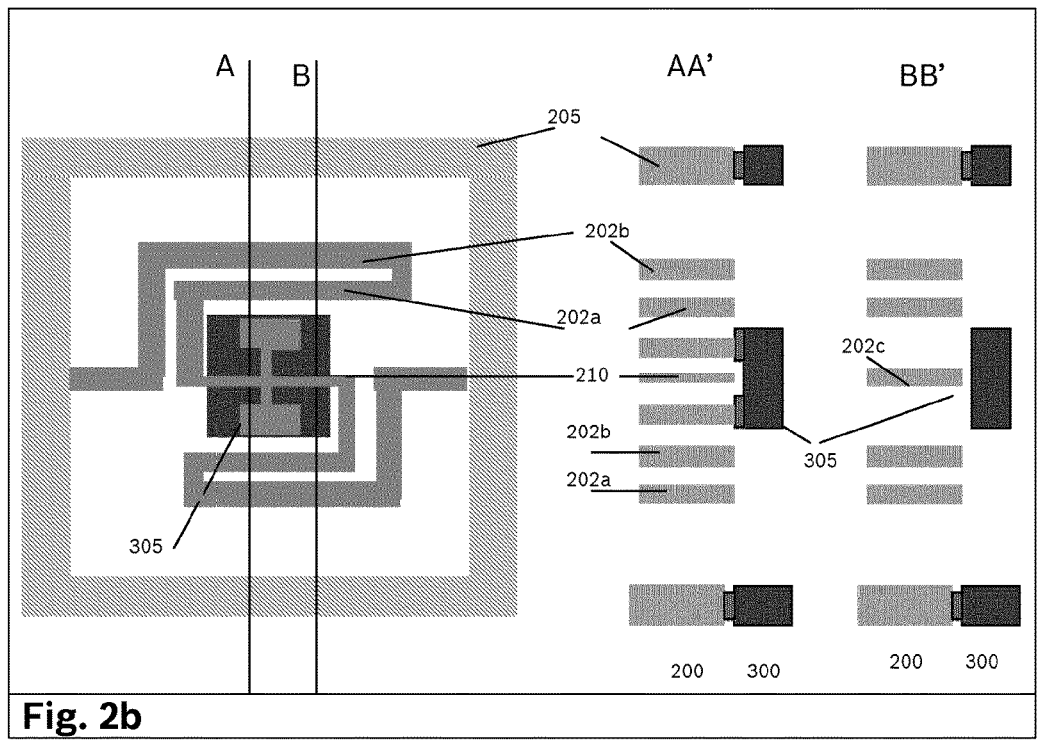

FIG. 2a shows a variant similar to that shown in FIG. 1, but having a central mirror suspension. The single central anchor 210 is located under the surface center of gravity of mirror plate 305. FIG. 2b shows a variant of the micromirror according to the present invention, which has two mirror suspensions, which are connected to one another with the aid of a spring element. The two anchors 210 are situated symmetrically to the surface normal through the surface center of gravity of mirror plate 305 and relatively close to this surface normal. It is advantageous in variant 2b compared to 2a that more twistable areas of the spring elements are situated under the mirror, whereby better surface utilization overall is possible for the available spring length. Above all, the central suspension has significant advantages with respect to the dynamic mirror deformation, since the engaging torque is minimal at this point.

Figure 3:
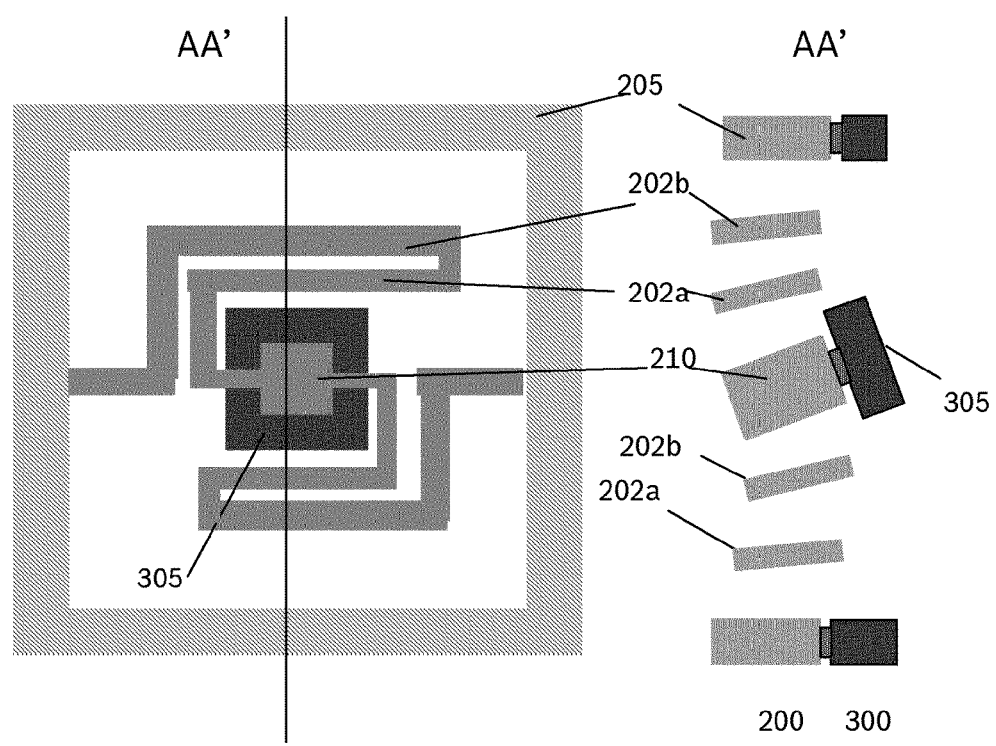
FIG. 3 shows a cross-sectional view of the micromirror according to the present invention in the deflected state.

FIG. 3 shows a cross-sectional view of the micromirror according to the present invention in the deflected state. It is shown how the tilting progresses gradually from spring element to spring element, so that the mirror may be tilted overall by >10°, each spring element experiencing a percentage twisting of the total torsion. Two spring elements are situated axially parallel on each side and one spring is situated under the mirror, on which the torsion is distributed by an angle of approximately 10°.

Figure 4:
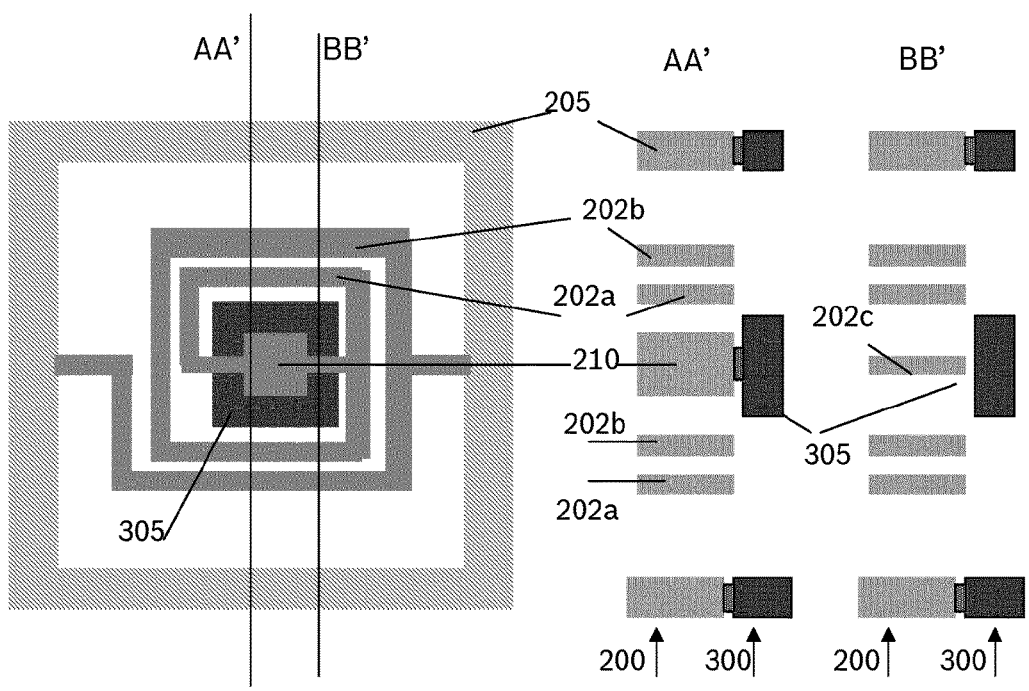
FIGS. 4 and 5 show another two exemplary embodiments of the micromirror according to the present invention having arrangements of multiple spring elements, which lie parallel to the rotational axis.
Figure 5:
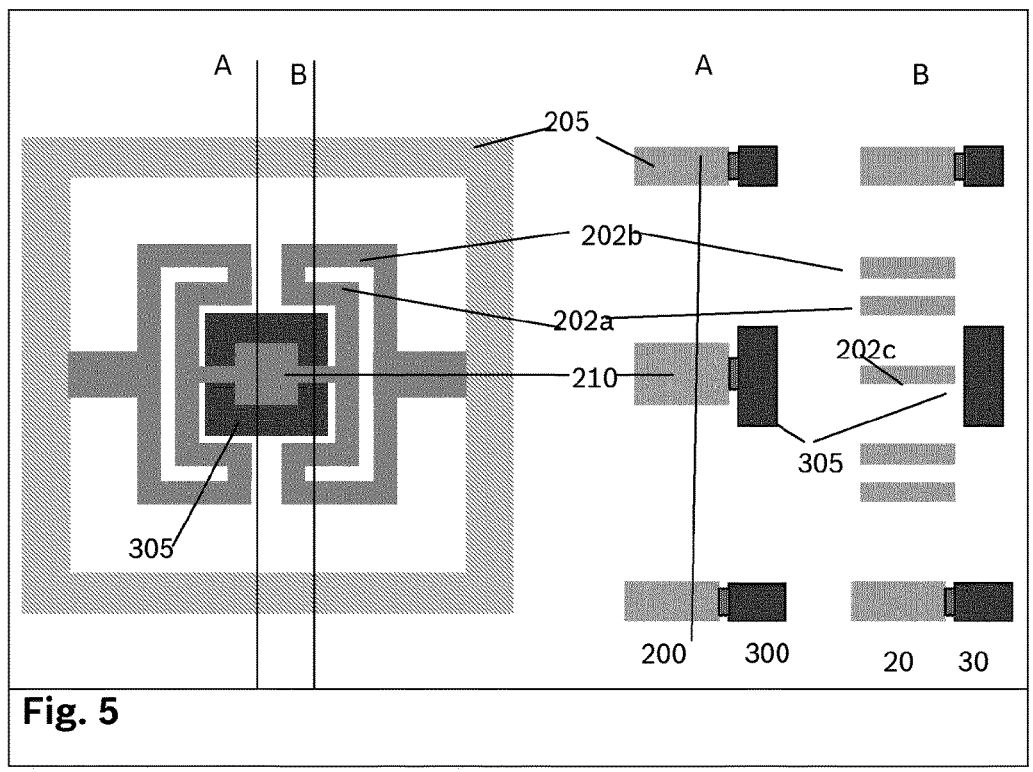

FIGS. 4 and 5 show two further exemplary embodiments of the micromirror according to the present invention having arrangements of multiple spring elements, which lie parallel to rotational axis 50. These exemplary embodiments are distinguished in that at least three spring elements are situated parallel to the rotational axis, on which the overall torsion is distributed in case of a mirror deflection.

FIG. 4 shows a variant in which the entire axial parallelism has been omitted. Such an arrangement may offer advantages with respect to the requirement of as many springs as possible in the smallest possible occupied surface. However, imbalances, interfering modes, and squaring effects must be eliminated by corresponding design measures, which are to be classified as critical in the case of such an arrangement.

FIG. 5 shows a completely symmetrical arrangement with respect to the rotational axis. In this case, two spring elements exist, which are located on the rotational axis. In addition to the spring elements under the mirror, the two elements, which attach the entire spring system to the frame, also twist when the mirror is deflected.

The drive of the micromirror may be carried out in various ways, for example, piezoelectrically, magnetically, or electrostatically. In the case of a magnetic drive, carrier elements, on which printed conductors are laid, which result in a resonant excitation of the structure upon suitable energization in a suitable B field, are provided in the first plane simultaneously with the springs.

Figure 6:
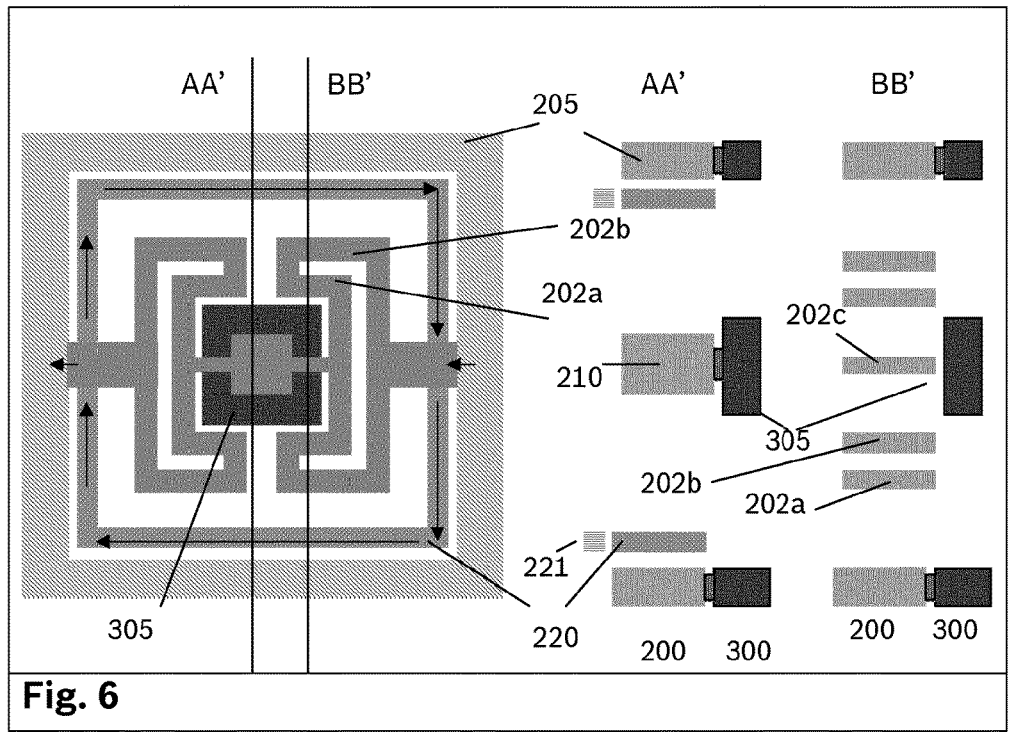
FIGS. 6 and 7 show another two specific embodiments of the micromirror according to the present invention having a magnetic drive.
Figure 7:
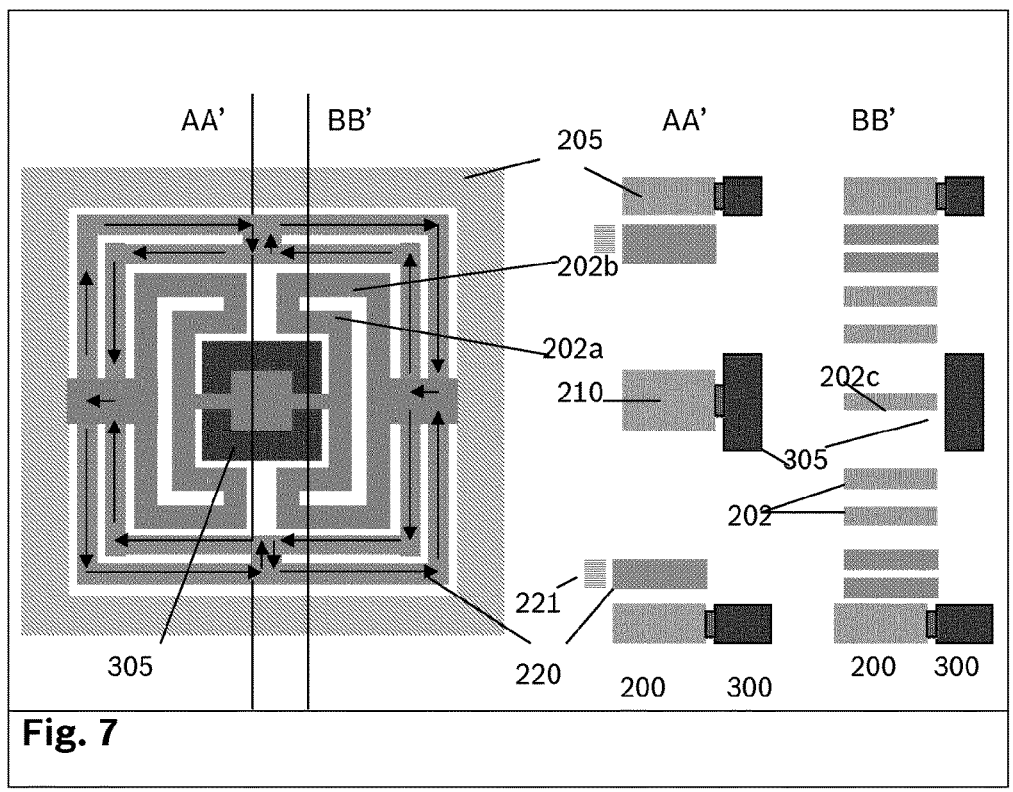

FIGS. 6 and 7 show two further specific embodiments of the micromirror according to the present invention having a magnetic drive.

FIG. 6 is based on the arrangement of FIG. 5. In addition to the spring system, an electromagnetic drive is implemented in the first plane. The outer frame would be designed to be relatively stiff in comparison to the spring elements, so that the printed conductors extending thereon experience a relatively small torsion. The arrows indicate the current direction. In this first specific embodiment, this is a printed conductor loop having the same rotational direction. The mirror is tilted out of the plane under a unidirectional magnetic field extending perpendicularly to the rotational axis in the chip plane. Upon application of an alternating current to the coil, which corresponds to the natural frequency of the mirror, the arrangement is driven in a resonant way.

In addition to an electromagnetic excitation, the arrangement may also be excited piezoelectrically, electrostatically, or thermomechanically. In particular, it is also possible to use an external excitation, for example, piezoelectric elements which are coupled to the chip or its cap, and transfer their energy to the oscillation of the mirror system in the event of excitation.

FIG. 7 shows an arrangement which corresponds to FIG. 5 with respect to the spring system. In contrast to FIG. 6, this structure originates from an axially symmetrical B field, as described in German Patent Application DE 102010062591.4.

In this case, four turns are used. The current flow is indicated by the arrow directions.

The torsion springs and the attachment of the spring system to the mirror plate are located in the first plane. To be able to manufacture both using the same processing step, the particular elements must have specific dimensions. The springs have a width of 50 µm in the area of the mirror plate, for example. These springs are exposed as necessary during the isotopic removal of the intermediate layer, also if the micromirror is located underneath in the second carrier layer. The attachment has a lateral dimension of greater than 100 µm, for example. In this area, the isotropic etching is not carried out completely, so that a mechanically stable attachment remains.

If the mirror surface is to have a preferably high reflectivity, the mirror should be implemented in a plane of preferably low roughness. Rear side 30 may be polished in the process sequence in the case of the micromirror according to the present invention described here. Rear side 30 is therefore outstandingly suitable for implementing a mirror of high optical quality. Since the mirror lies in the plane of the rear side of the second layer, a small distance may be implemented between a first mirror and a second mirror, the tilt direction of which lies perpendicularly to the tilt direction of the first mirror, for example. However, it would also be possible, in contrast, to implement the mirror on the rear side of first layer 200, i.e., on or below intermediate layer 250. The distance between the first and second mirrors is greater in this case, however.

As an additional degree of freedom in the design, the option exists of fixing parts of the spring system on the surface.

This could be implemented by anodic bonding. By way of appropriate structuring of a glass plate, specific areas being etched at least enough that depressions result, no connection will take place at the points of these depressions when the glass plate is connected to the front side of the spring system. The spring system will be fixed on the glass plate at the points at which the glass plate was not deeply etched.

Figure 8:
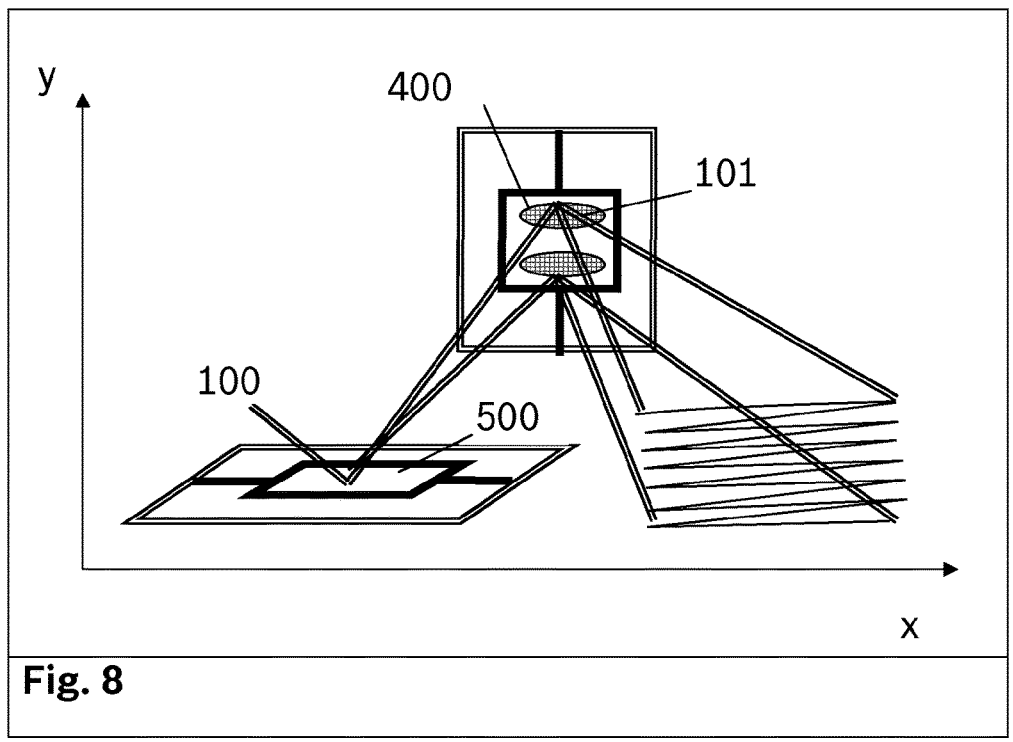
FIG. 8 shows a two-mirror system having a micromirror according to the present invention.

FIG. 8 shows a two-mirror system having a micromirror according to the present invention. A two-mirror system in the form of a 2×1D scanner is shown having a first mirror 500 and at least having one second micromirror according to the present invention as described above. The first mirror has a first rotational axis parallel to coordinate axis x and second micromirror 400 has a second rotational axis parallel to coordinate axis y. Second rotational axis y is situated perpendicularly to first rotational axis x. Second micromirror 400 is situated in relation to first mirror 500 in such a way that a laser beam 100, which irradiates both mirrors 400, 500, is deflectable in two directions x and y. The extension of the rectangular mirror surface of the second micromirror is selected in such a way that in dimension x, the elliptical light spot of diagonally incident laser beam 100 finds sufficient surface area, and sufficient surface area is available in dimension y for the various locations of the light spot on second mirror 400 as a result of the deflection by first mirror 500.

Figure 9:
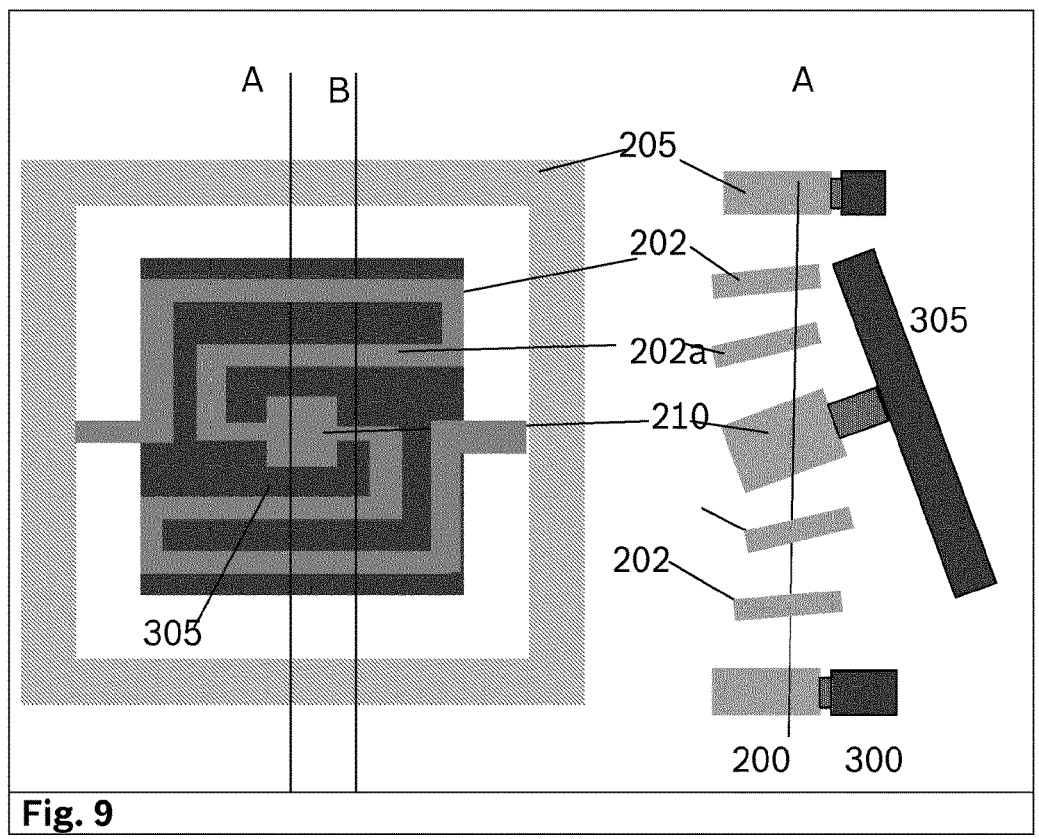
FIG. 9 shows an exemplary embodiment of the micromirror according to the present invention, in which the spring elements lie below the mirror.

FIG. 9 shows an exemplary embodiment of the micromirror according to the present invention, in which the spring elements lie under the mirror. The advantage of this arrangement is a further improved surface utilization. Connection area 23 is increased in this example enough that the mirror and the springs do not strike one another upon tilting of the mirror.

What is claimed is:

1. A micromirror, comprising:
   a first layer having a first main extension plane;
   a second layer having a second main extension plane;
   the first main extension plane and the second main extension plane being situated parallel to one another;
   the first layer and the second layer being sectionally connected to one another via at least one connection area;
   at least one spring element being implemented in the first layer;
   a movably suspended mirror plate being implemented in the second layer;
   the mirror plate having a mirror surface on a first side parallel to the first and second main extension planes and being connected on an opposing second side via the connection area to an anchor of the spring element, wherein:
   the anchor is implemented in the first layer,
   from a perspective that is perpendicular to the first and second main extension planes, the anchor coupled with the mirror plate has a width that is larger than a width of the spring element in a location remote from the anchor so as to minimize a torque at the mirror plate,
   in a direction that is perpendicular to the first and second main extension planes, a thickness of the spring element is equal to a thickness of the anchor; and
   a part of the spring element on the second side of the mirror plate being movably situated in relation to the mirror plate, and
   in the perspective that is perpendicular to the first and second main extension planes, the spring element has a meander configuration having an outer periphery that at least partially surrounds an outer periphery of the mirror plate formed by an outermost edge of the mirror plate.

2. The micromirror as recited in claim 1, wherein the connection area is formed from an intermediate layer between the first layer and the second layer.

3. The micromirror as recited in claim 1, wherein the connection area is formed from a structured partial area of at least one of the first layer and the second layer.

4. The micromirror as recited in claim 3, wherein a predominant part of the spring element on the second side of the mirror plate is movably situated in relation to the mirror plate.

5. The micromirror as recited in claim 4, wherein the mirror plate is movable around a rotational axis and the spring element has at least one web which is situated parallel to the rotational axis.

6. The micromirror as recited in claim 5, wherein the spring element has at least three webs which are situated parallel to the rotational axis.

7. The micromirror as recited in claim 1, wherein the anchor is situated under a surface center of gravity of the mirror plate.

8. The micromirror as recited in claim 1, wherein the spring element has a first extension perpendicular to the first main extension plane and a second extension parallel to the first main extension plane, the first extension being greater by the factor of 2, than the second extension.

9. The micromirror as recited in claim 1, wherein the spring element has a first extension perpendicular to the first main extension plane and a second extension parallel to the first main extension plane, the first extension being greater by the factor of 10, than the second extension.

10. The micromirror as recited in claim 1, wherein the micromirror has at least two spring elements which are connected to a shared anchor.

11. The micromirror as recited in claim 1, wherein the micromirror has at least two spring elements which are each connected to a separate anchor.

12. The micromirror as recited in claim 1, wherein a first frame is implemented in the first layer and the spring element is connected to the first frame.

13. The micromirror as recited in claim 12, wherein a second frame, which is connected to the first frame via the connection area, is implemented in the second layer.

14. The micromirror as recited in claim 1, wherein the at least one connection area is an intermediate layer directly connected to the first layer and the second layer.

15. The micromirror as recited in claim 1, wherein the anchor and the spring element are co-planar with respect to each other in the first main extension plane.

16. The micromirror as recited in claim 1, wherein:
   in the meander configuration of the spring element:
   a first section of the spring element runs perpendicular to a rotational axis of the mirror plate,
   a second section of the spring element includes a first end connected to the first section and runs parallel to the rotational axis,
   a third section of the spring element has a first end connected to a second end of the second section and runs perpendicular to the rotational axis,
   a fourth section of the spring element has a first end connected to a second end of the third section and runs parallel to the rotational axis, and
   the first section, the second section, the third section, and the fourth section are co-planar with each other in the first main extension plane.

17. The micromirror as recited in claim 16, wherein:
   the second and fourth sections are longer than the first and third sections in the first main extension plane.

18. The micromirror as recited in claim 1, wherein the connection area connects an edge periphery of the first layer to an edge periphery of the second layer.

19. The micromirror as recited in claim 1, wherein the thickness of the spring element and the anchor is greater than an extension of the spring element parallel to the first main extension plane and an extension of the anchor parallel to the first main extension plane by the factor of 10.

20. The micromirror as recited in claim 1, wherein the spring element extends under the mirror in two directions that are at an angle to one another.

21. The micromirror as recited in claim 20, wherein the angle is ninety degrees.

22. The micromirror as recited in claim 1, further comprising an electromagnetic drive situated in the first plane.

23. The micromirror as recited in claim 1, wherein:
the anchor includes a first anchor section and a second anchor section, and
the first anchor section and the second anchor section are displaced from a rotational axis of the mirror plate so that, in the direction that is perpendicular to the first and second main extension planes, the rotational axis does not intersect the first anchor and does not intersect the second anchor.

24. A two-mirror system, comprising:
a first micromirror, and at least having one second micromirror, each of the micromirrors including a first layer having a first main extension plane, a second layer having a second main extension plane, the first main extension plane and the second main extension plane being situated parallel to one another, the first layer and the second layer being sectionally connected to one another via at least one connection area, at least one spring element being implemented in the first layer, a movably suspended mirror plate being implemented in the second layer, the mirror plate having a mirror surface on a first side parallel to the first and second main extension planes and being connected on an opposing second side via the connection area to an anchor of the spring element, and a part of the spring element on the second side of the mirror plate being movably situated in relation to the mirror plate, wherein the anchor is implemented in the first layer, and wherein, from a perspective that is perpendicular to the first and second main extension planes, the anchor coupled with the mirror plate has a width that is larger than a width of the spring element in a location remote from the anchor so as to minimize a torque at the mirror plate;
wherein:
the two mirror system represents a 2D scanner, the first mirror having a first rotational axis x and the second micromirror having a second rotational axis y which is perpendicular to the first rotational axis of the first mirror, the second micromirror being situated opposite the first mirror, in such a way that a laser beam which irradiates both mirrors is deflectable in two directions;
in a direction that is perpendicular to the first and second main extension planes, a thickness of the spring element is equal to a thickness of the anchor, and
in the perspective that is perpendicular to the first and second main extension planes, the spring element has a meander configuration having an outer periphery that at least partially surrounds an outer periphery of the mirror plate formed by an outermost edge of the mirror plate.

25. The two-way mirror system as recited in claim 24, wherein the anchor and the spring element are co-planar with respect to each other in the first main extension plane.

26. The two-mirror system as recited in claim 24, wherein:
in the meander configuration of the spring element:
a first section of the spring element runs perpendicular to a rotational axis of the mirror plate,
a second section of the spring element includes a first end connected to the first section and runs parallel to the rotational axis,
a third section of the spring element has a first end connected to a second end of the second section and runs perpendicular to the rotational axis,
a fourth section of the spring element has a first end connected to a second end of the third section and runs parallel to the rotational axis, and
the first section, the second section, the third section, and the fourth section are co-planar with each other in the first main extension plane.

27. The two-mirror system as recited in claim 26, wherein:
the second and fourth sections are longer than the first and third sections in the first main extension plane.

28. The two-mirror system as recited in claim 24, wherein the connection area connects an edge periphery of the first layer to an edge periphery of the second layer.

29. The micromirror as recited in claim 1, wherein the thickness of the spring element and the anchor is greater than an extension of the spring element parallel to the first main extension plane and an extension of the anchor parallel to the first main extension plane by the factor of 2.

30. The two-mirror system as recited in claim 24, wherein the thickness of the spring element and the anchor is greater than an extension of the spring element parallel to the first main extension plane and an extension of the anchor parallel to the first main extension plane by the factor of 2.

31. The two-mirror system as recited in claim 24, wherein the thickness of the spring element and the anchor is greater than an extension of the spring element parallel to the first main extension plane and an extension of the anchor parallel to the first main extension plane by the factor of 10.

32. The two-mirror system as recited in claim 24, wherein the spring element extends under the mirror in two directions that are at an angle to one another.

33. The two-mirror system as recited in claim 24, wherein the angle is ninety degrees.

34. The two-mirror system as recited in claim 24, further comprising an electromagnetic drive situated in the first plane.

35. The two-mirror system as recited in claim 24, wherein:
the anchor includes a first anchor section and a second anchor section, and
the first anchor section and the second anchor section are displaced from a rotational axis of the mirror plate so that, in the direction that is perpendicular to the first and second main extension planes, the rotational axis does not intersect the first anchor and does not intersect the second anchor.

* * * * *